(12) United States Patent
Yu

(10) Patent No.: US 8,049,461 B2
(45) Date of Patent: Nov. 1, 2011

(54) DUMMY BATTERY APPARATUS

(75) Inventor: Ching-Chung Yu, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 638 days.

(21) Appl. No.: 12/184,323

(22) Filed: Aug. 1, 2008

(65) Prior Publication Data

US 2009/0153128 A1   Jun. 18, 2009

(30) Foreign Application Priority Data

Dec. 14, 2007   (CN) .......................... 2007 1 0203077

(51) Int. Cl.
  *H02J 7/02*   (2006.01)
  *H02J 7/00*   (2006.01)
  *H01M 14/00*  (2006.01)
(52) U.S. Cl. ........ 320/111; 320/107; 320/112; 320/114; D13/103; D13/119; 429/7

(58) Field of Classification Search ................... 320/112
See application file for complete search history.

(56) References Cited

U.S. PATENT DOCUMENTS

| 6,091,224 | A | * | 7/2000 | Morita | 320/113 |
| D541,213 | S | * | 4/2007 | Tang | D13/103 |
| 2008/0131760 | A1 | * | 6/2008 | Yamagami et al. | 429/82 |
| 2009/0129069 | A1 | * | 5/2009 | Grossman | 362/189 |

FOREIGN PATENT DOCUMENTS

JP         2007088590 A  *  4/2007

\* cited by examiner

*Primary Examiner* — Edward Tso
*Assistant Examiner* — Ahmed Omar
(74) *Attorney, Agent, or Firm* — Altis Law Group, Inc.

(57) ABSTRACT

The invention discloses a dummy battery apparatus (30), configured for supplying power to a portable electronic device (10). The portable electronic device (10) has a circuit board (13), which sets at least one testing port (130). The dummy battery apparatus (30) defines at least one gap thereon, and the defining place of the gap is corresponding to the location of the testing port (130) of the circuit board (13).

13 Claims, 5 Drawing Sheets

DUMMY BATTERY APPARATUS

BACKGROUND OF THE INVENTION

1. Technical Field

The present invention generally relates to dummy battery apparatus, particularly to a dummy battery apparatus configured for supplying power to a portable electronic device, such as mobile phone, personal digital assistant (PDA), and so on, in a test process.

2. Discussion of the Related Art

With the developments of wireless communication and information processing technologies, portable electronic devices such as mobile phones and personal digital assistants (PDAs) are now in widespread use, and consumers may now enjoy the full convenience of high technology products almost anytime and anywhere. To assure and satisfy the qualities of the portable electronic devices, pre-distribution tests are required.

A typical portable electronic device generally includes a circuit board, which has at least one testing port such as a global positioning system (GPS) testing port, a radio frequency (RF) testing port, a Bluetooth testing port, and other testing ports, disposed thereon. During a testing process, a battery of the portable electronic device is required to be removed from a battery receiving portion of the portable electronic device, To access the testing ports of the portable electronic device's circuit board. As a result, during the testing process, the portable electronic device has no power because the battery is removed. However, the portable electronic device must be powered during the testing process.

Therefore, a dummy battery apparatus is desired in order to overcome the above-described shortcoming.

BRIEF DESCRIPTION OF THE DRAWING

Many aspects of the present dummy battery apparatus can be better understood with reference to the following drawings. The components in the drawings are not necessarily drawn to scale, the emphasis instead being placed upon clearly illustrating the principles of the present dummy battery apparatus. Moreover, in the drawings, like reference numerals designate corresponding parts throughout the several views.

DETAILED DESCRIPTION OF THE EMBODIMENT

Figure 1:
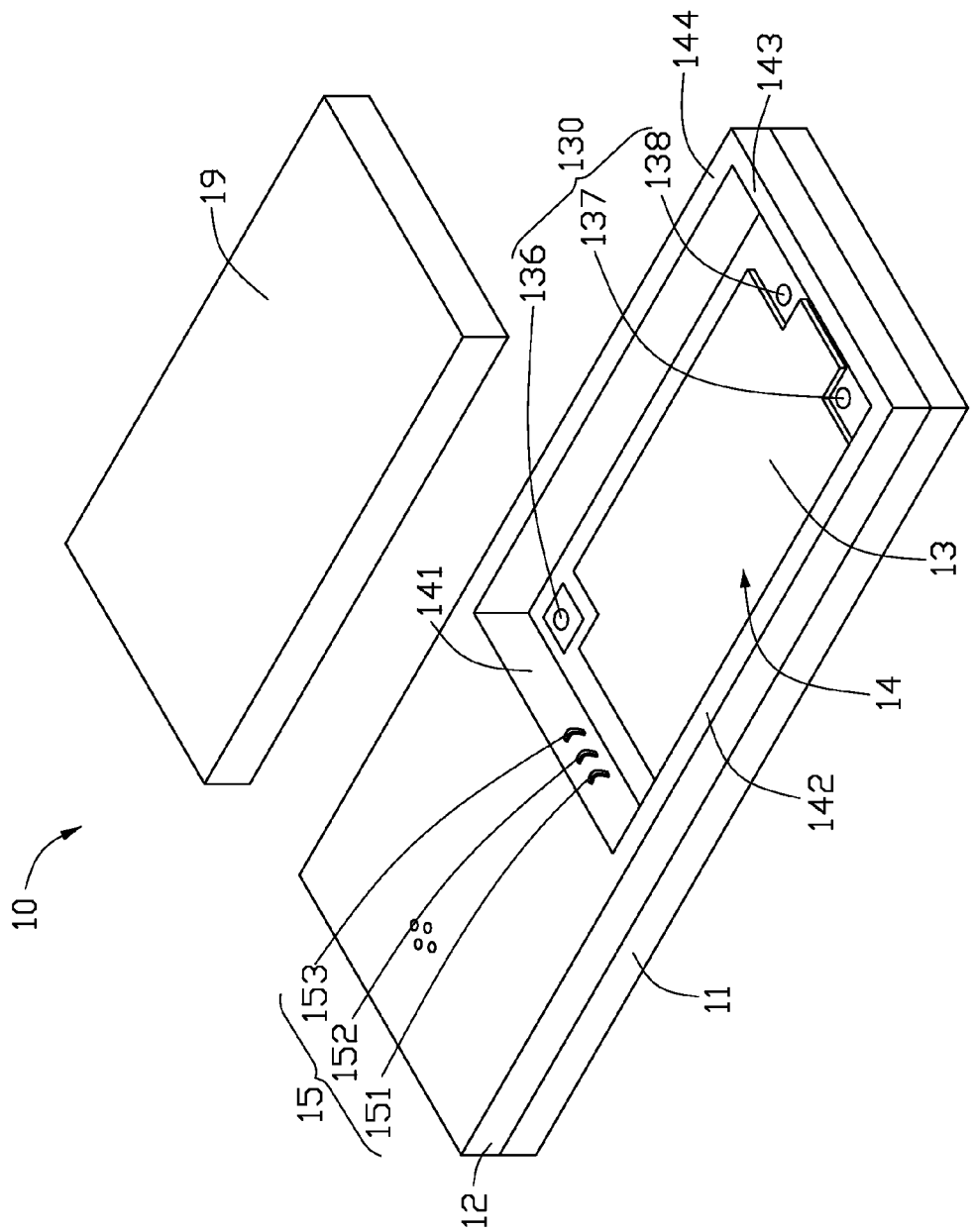
FIG. 1 shows a schematic, perspective view of a portable electronic device, with a battery being detached therefrom.

The present dummy battery apparatus is particularly suitable for portable electronic devices, such as mobile phones, personal digital assistants (PDAs), and the like. Referring now to the drawings in detail, FIG. 1 shows a schematic, perspective view of a portable electronic device 10. The portable electronic device 10 includes a front cover 11, a back cover 12, a circuit board 13, a connector 15, and a battery 19.

The front cover 11 and the back cover 12 are attached to each other, and cooperatively define a receiving space (not labeled) for receiving electronic components (i.e. the circuit board 13) therein. The back cover 12 has a receiving cavity 14 defined therethrough, and has a first sidewall 141, a second sidewall 142, a third sidewall 143, and a fourth sidewall 144 together forming the receiving cavity 14.

The circuit board 13 is mounted/disposed between the front cover 11 and the back cover 12. The circuit board 13 includes at least one testing port 130 disposed thereon. The testing port 130 is configured for electronically connecting with a testing apparatus. In the present embodiment, the circuit board 13 has three testing ports 130 including a global positioning system (GPS) testing port 136, a radio frequency (RF) testing port 137, and a Bluetooth testing port 138. The testing ports 136, 137, 138 are exposed in the receiving cavity 14. For example, the GPS testing port 136 may be disposed adjacent to a joint of the first and the fourth sidewalls 141, 144, and the RF testing port 137 and the Bluetooth testing port 138 may both be disposed adjacent to the third sidewall 143.

The connector 15 includes a positive pin 151, a negative pin 152, and an identification (ID) pin 153. The pins 151, 152, 153 all protrude from the first sidewall 141 to the battery receiving cavity 14, and are configured for electrically connecting with the battery 19.

The battery 19 has a shape and size corresponding with that of the receiving cavity 14 so that the battery 19 can be fittingly and detachably received in the receiving cavity 14. When the battery 19 is received in the receiving cavity 14, the battery 19 electrically connects with the connecter 15 so as to supply electrical power to the portable electronic device 10.

Figure 2:
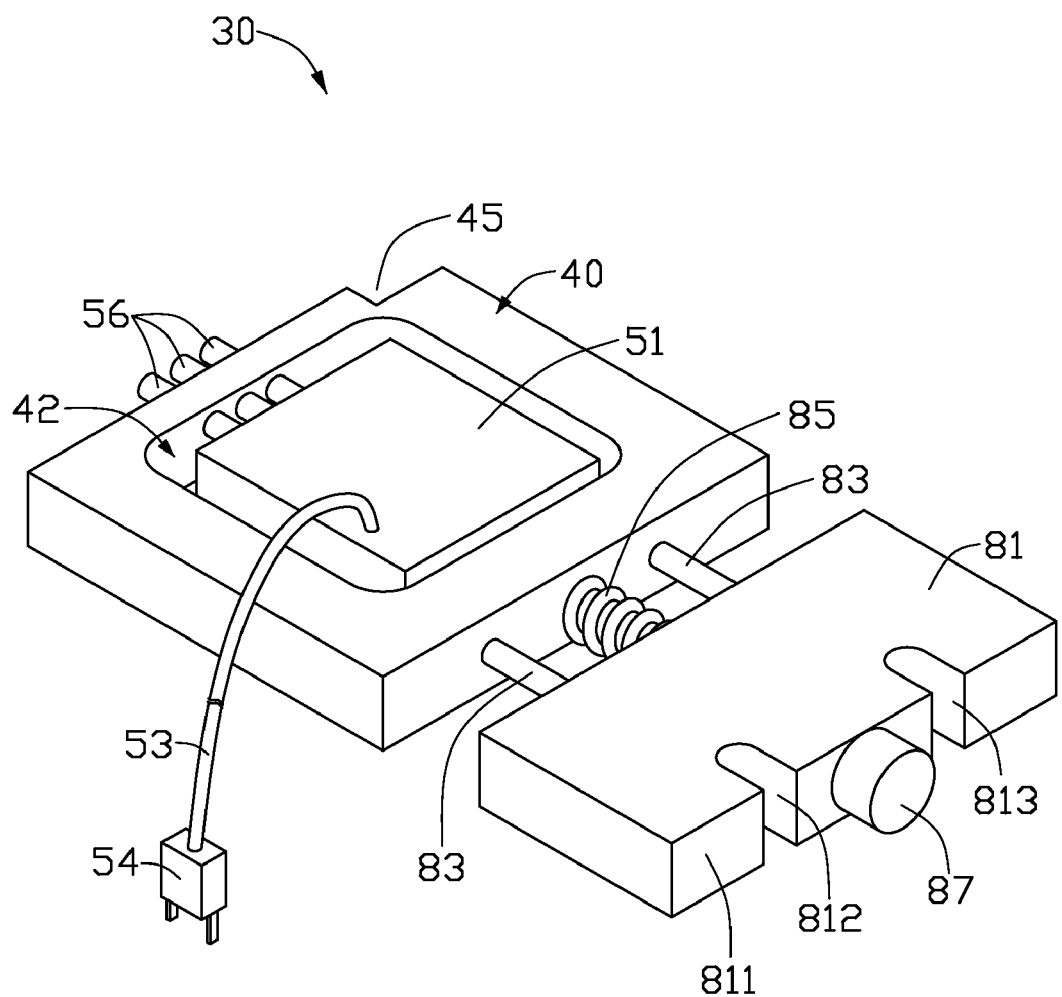
FIG. 2 shows a perspective view of a dummy battery apparatus, according to an exemplary embodiment.
Figure 3:
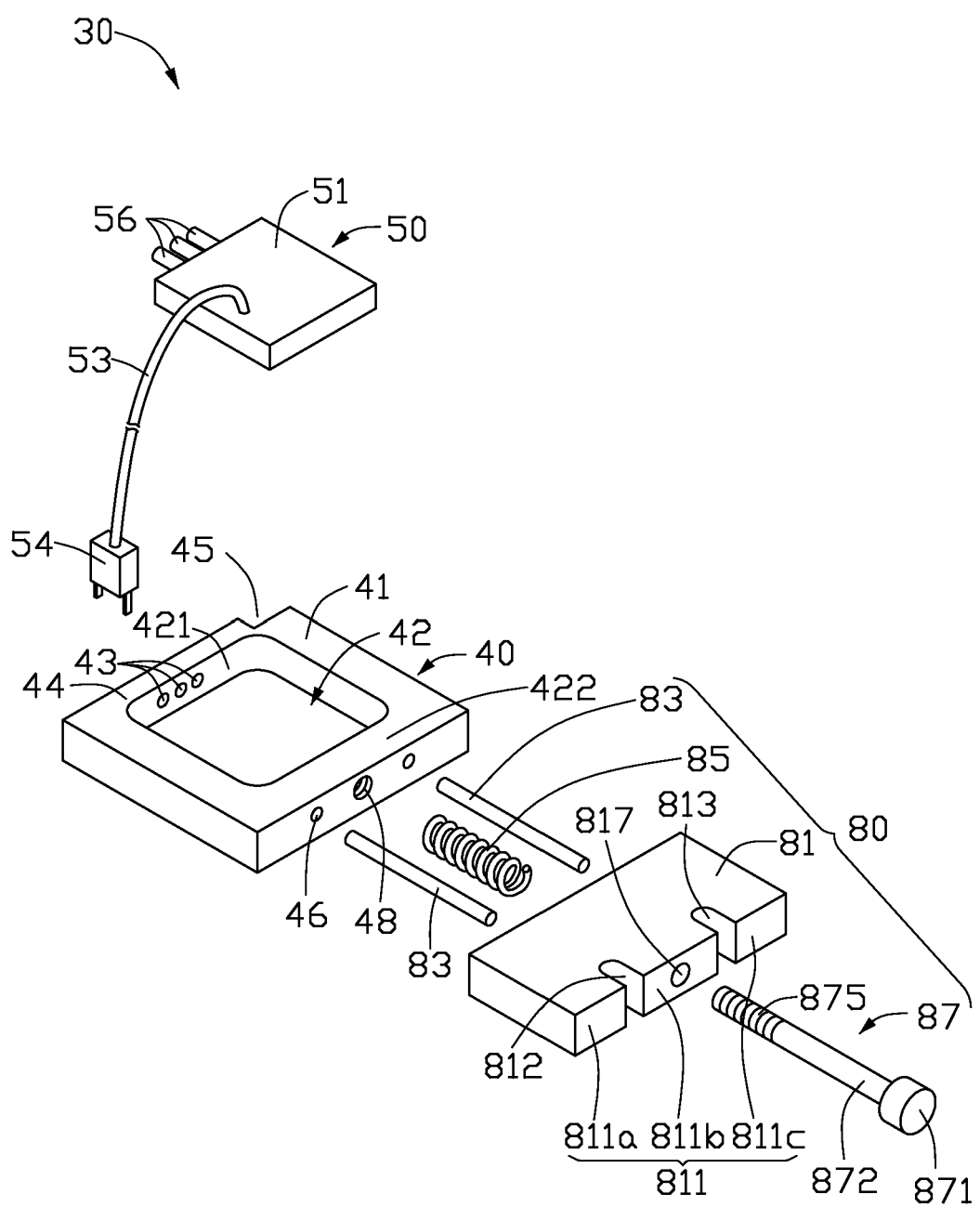
FIG. 3 shows a disassembled, perspective view of the dummy battery apparatus of FIG. 2.
Figure 4:
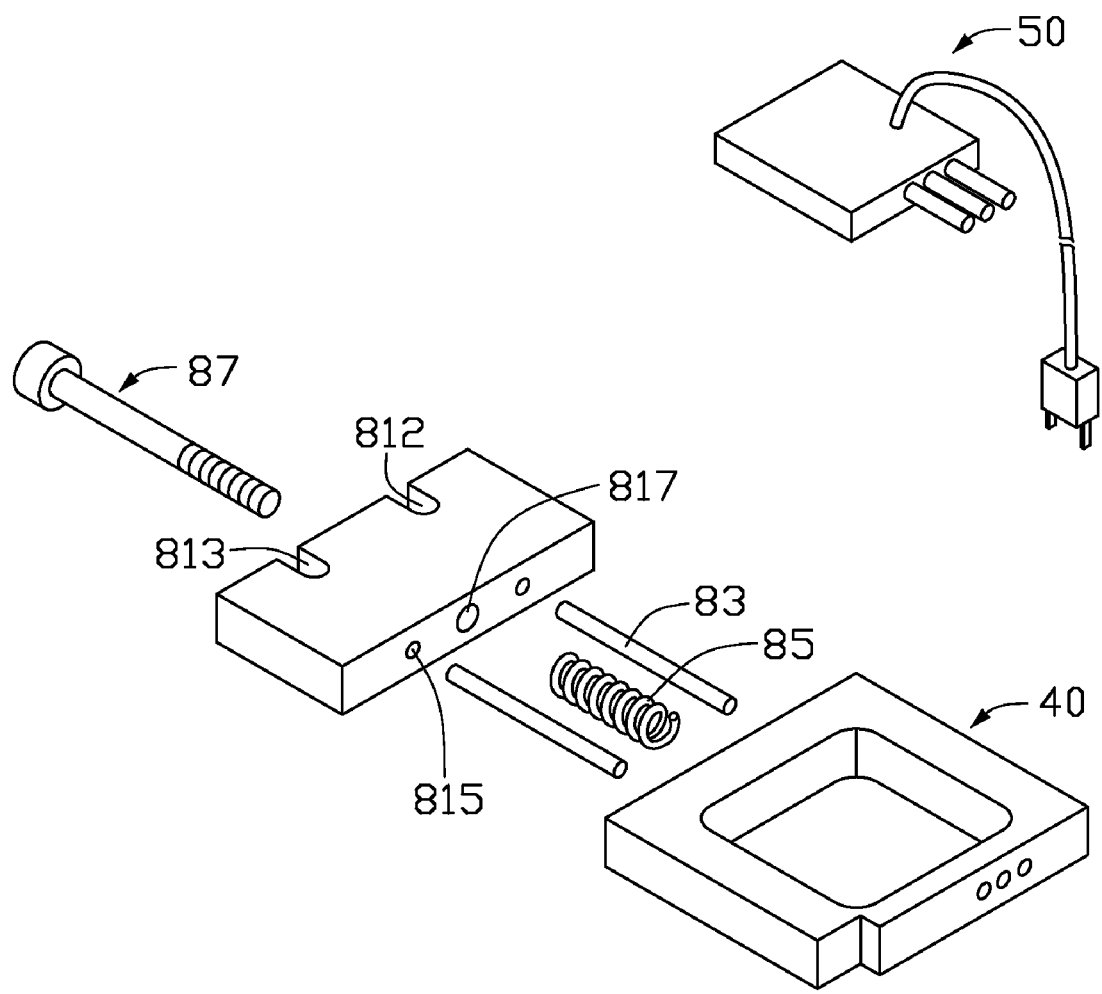
FIG. 4 is similar to FIG. 3, but viewed from another aspect.

Referring to FIG. 2 and FIG. 3, the dummy battery apparatus 30 has a shape and size corresponding with that of the receiving cavity 14 so that the dummy battery apparatus 30 can be fittingly and detachably received in the receiving cavity 14 to supply electrical power to the portable electronic device 10 during a test process. The dummy battery apparatus 30 includes a main body 40, a transformer device 50 (FIG. 3), an adjusting device 80 (FIG. 3), and at least one gap. A first gap 45 is defined at a corner of the main body. A second gap 812 and a third gap 813 are defined in the adjusting device 80.

The main body 40 is a substantially rectangular frame having an upper surface 41, a first wall 421, and a second wall 422 opposite to the first wall 421. The main body 40 has an accommodating cavity 42 defined in the upper surface 41, between the first and the second walls 421, 422. The accommodating cavity 42 is configured for receiving the transformer device 50 therein. The first and the second walls 421, 422 are both approximately perpendicular to the upper surface 41 of the main body 40. The first wall 421 has three through holes 43 defined therethrough thereby allowing the accommodating cavity 42 to communicate with the area outside of main body 40. Each through hole 43 corresponds with one of the connectors 15 of the portable electronic device 10. The second wall 422 has an outer surface positioned opposite to the inner surface. The outer surface of second wall 422 further has two blind holes 46 and a screw hole 48 penetrating entirely through second wall 422. The screw hole 48 is between the two blind holes 46. The first gap 45 of the main body 40 allows the GPS testing port 136 to be exposed for interaction with testing equipment.

The transformer device 50 is substantially rectangular and configured for being assembled within the accommodating cavity 42 of the main body 40. The transformer device 50 is configured for converting alternating current into direct current, to provide electrical power to the portable electronic device 10. The transformer device 50 includes a base 51, a power supply input line 53, a plug 54 and three output pins 56. The base 51 includes a transformer circuit (not shown) assembled therein. The transformer circuit is electronically connected with a source of alternating current by the power supply input line 53 and the plug 54. The three output pins 56 are configured to insert through the holes 43 of the first wall 421 of the main body 40 and electronically connect with the connector 15 of the portable electronic device 10, to supply electrical power to the portable electronic device 10.

The adjusting device 80 allows adjustment of the length of the dummy battery apparatus 30. The adjusting device 80 includes an adjusting block 81, two guiding posts 83, an elastic member 85 and a bolt 87.

The adjusting block 81 includes a side surface 811 formed into three smaller surfaces 811a, 811b, 811c by second and the third gaps 812, 813 that penetrate from upper and bottom surfaces (not labeled) of block 81. The second gap 812 and the third gap 813 allow the RF testing port 137 and the Bluetooth testing port 138 to be exposed for interacting with testing equipment. The adjusting board 81 further has two through holes 815, and a connecting through hole 817 defined therethrough. Through holes 815 completely extend through block 81 and one hole 815 is aligned with the second gap 812 and the other hole 815 is aligned with the third gap 813. The side surface 811b of the adjusting board 81 further has a connecting through hole 817 defined therethrough, and positioned defined between the two through holes 815.

The two guiding posts 83 are substantially cylindrical column in shape, and configured for inserting into the two through holes 815, respectively. In this embodiment, one guiding post 83 has one of its ends securely positioned in one of the blind holes 46 and its other end inserted into one of the through holes 815. The other guiding post 83 has one of its ends securely positioned in the other blind hole 46 and its other end inserted into the other through holes 815.

The elastic piece 85 can be a helical spring. The bolt 87 includes a head 871, a shaft portion 872 and a threaded portion 875. The bolt 87 is configured for passing through the through hole 817 of the adjusting board 81, and threadly engaging with the screw hole 48.

In assembly, the transformer 50 is received in the rectangular accommodating cavity 42 of the main body 40, and the output pins 56 of the transformer device 50 pass through the main body 40 by the three through holes 43. One end of each guiding post 83 is securely connected with a corresponding blind hole 46 of the main body 40, and the other end of thereof is slidingly inserted into a corresponding through hole 815 of the adjusting board 81. The bolt 87 penetrates through the connecting through hole 817 of the adjusting board 81 and the elastic piece 85, and threadedly engages with the inner screw thread blind hole 48 of the main body 40.

Figure 5:
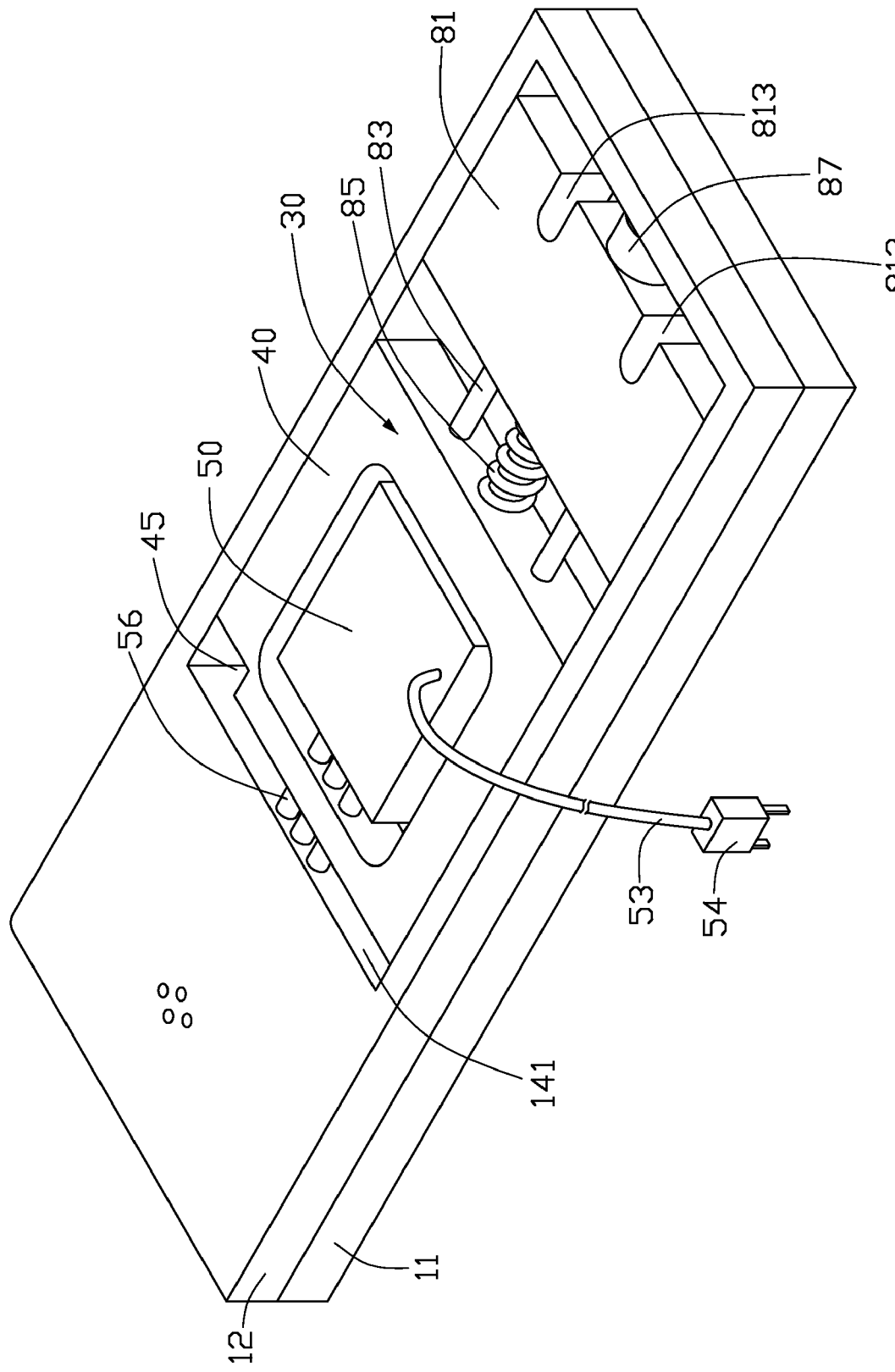
FIG. 5 shows a schematic, perspective view of the portable electronic device using the dummy battery apparatus therein.

Also referring to FIG. 5, when using the dummy battery apparatus 30, the length of the dummy battery apparatus 30 can be adjust by rotating the bolt 87 of the adjusting device 80, to make sure that the dummy battery apparatus 30 can be assembled within the receiving cavity 14 of the back cover 12 of the portable electronic device 10. The output pins 56 of the transformer device 50 are electronically connected with the positive elastic pin 151, the negative elastic pin 152 and the ID elastic pin 153 of the connector 15, respectively, to supply electrical power to the portable electronic device 10. The first gap 45, the second gap 812 and the third gap 813 of the dummy battery apparatus 30 corresponds to the GPS testing port 136, the RF testing port 137 and the Bluetooth testing port 138 of the circuit board 13, respectively. Therefore, the GPS testing port 136, the RF testing port 137 and the Bluetooth testing port 138 of the circuit board 13 are exposed from the corresponding first gap 45, the second gap 812 and the third gap 813 of the dummy battery apparatus 30. When the bolt 87 is rotated, the adjusting board 81 jointly presses or releases the elastic piece 85, and the adjusting board 81 slides along with the two guiding posts 83, to adjust the length of dummy battery apparatus 30. The plug 54 of the transformer device 50 is electrically connected with an alternating current, and transfers the alternating current into direct current, so as to supply the direct current to the portable electronic device 10. The GPS testing port 136, the RF testing port 137 and the Bluetooth testing port 138 of the circuit board 13 are electronically connected to testing lines (not shown) of the testing device (not shown). Then, the testing process of the portable electronic device 10 can begin.

It is to be understood that, the two guiding posts 83 could be integrally made or formed with the main body 40, for example, the two guiding posts 83 protrude out of the out surface of the second wall 421 of the main body 40 and spaced from each other, and the inner screw thread blind hole 48 is defined between the two guiding posts 83.

It is also to be understood that, the adjusting device 80 may be substituted by a elastic piece 85, and the elastic piece 85 is assembled within the receiving cavity 14, and resisted between the main body 40 and the side surface of the battery receiving space.

It is also understood that the elastic piece 85 can be but not limit to a helical spring, it also could be a board spring, a rubber or a flexible pad etc.

It is also understood that the two guiding posts 83 can be omitted, and the distance between the adjusting board 81 and the main body 40 can be adjusted by the bolt 87 of the adjusting device 80.

It is also understood that the dummy battery apparatus 30 also could be substituted by a battery defining gaps corresponding the testing ports 130 to expose the testing ports 130 therefrom.

Finally, it is to be understood, however, that even though numerous characteristics and advantages of the present invention have been set forth in the foregoing description, together with details of the structure and function of the present invention, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. A dummy battery apparatus configured for supplying power to a portable electronic device during testing the portable electronic device, the portable electronic device having a circuit board, and at least one testing port disposed on the circuit board; the dummy battery apparatus comprising:
   a main body for supplying power; and
   at least one gap defined in the main body, the at least one gap aligned with the testing port to expose the at least one testing port;
   a transformer device mounted on the main body, the transformer device configured to convert alternating current into direct current;
   wherein the main body has an accommodating cavity defined therein to receive the transformer device; the accommodating cavity has a side surface, and three through holes defined through the side surface and communicating with the accommodating cavity; and the transformer device includes three output pins insert through and extending out of the three through holes.

2. The dummy battery apparatus as claimed in claim 1 further comprising an adjusting device wherein the adjusting device comprising an elastic member contacting with the main body.

3. The dummy battery apparatus as claimed in claim 2, wherein the adjusting device further comprises an adjusting board and a bolt, and the bolt penetrates through the adjusting board and the elastic member, and threadly engages with the main body.

4. The dummy battery apparatus as claimed in claim 3, wherein the adjusting board defines at least one gap there in exposing the at least one testing port.

5. The dummy battery apparatus as claimed in claim 3, wherein the adjusting board further comprises two guiding posts, one end of each guiding posts is assembled with the main body and the other end of each posts is slidably engaged with the adjust board.

6. The dummy battery apparatus as claimed in claim 5, wherein the two guiding posts are integrally formed on the main body.

7. A power device configured for supplying power to a portable electronic device during testing the portable electronic device, the portable electronic device having a circuit board, and at least one testing port disposed on the circuit board; the power device comprising:
   a main body for supplying power to the portable electronic device; and
   at least one gap defined in the main body corresponding to the at least one testing port to test the portable electronic device;
   an adjusting device comprising an elastic member contacting with the main body;
   wherein the adjusting device further comprises an adjusting board and a bolt, and the bolt penetrates through the adjusting board and the elastic member, and threadly engages with the main body.

8. The power device as claimed in claim 7 further comprising a transformer device mounted on the main body, wherein the transformer device is configured to convert alternating current into direct current.

9. The power device as claimed in claim 8, wherein the main body has an accommodating cavity defined therein to receive the transformer device.

10. The power device as claimed in claim 9, wherein the accommodating cavity has a side surface, and three through holes defined through the side surface and communicating with the accommodating cavity; and the transformer device includes three output pins insert through and extending out of the three through holes.

11. The power device as claimed in claim 7, wherein the adjusting board defines at least one gap there in exposing the at least one testing port.

12. The power device as claimed in claim 11, wherein the adjusting board further comprises two guiding posts, one end of each guiding posts is assembled with the main body and the other end of each posts is slidably engaged with the adjust board.

13. The power device as claimed in claim 12, wherein the two guiding posts are integrally formed on the main body.

* * * * *